United States Patent [19]
Fukui

[11] Patent Number: 5,499,393
[45] Date of Patent: Mar. 12, 1996

[54] RECEIVER WITH FUNCTION TO ADJUST LOCAL FREQUENCY FOLLOWING RECEPTION FREQUENCY

[75] Inventor: Sinichi Fukui, Hyogo, Japan

[73] Assignee: Mitsubishi Denki Kabushiki Kaisha, Tokyo, Japan

[21] Appl. No.: 246,632

[22] Filed: May 20, 1994

[30] Foreign Application Priority Data

Jun. 10, 1993 [JP] Japan .................... 5-163803

[51] Int. Cl.$^6$ .................................. H04B 7/00
[52] U.S. Cl. .................. 455/264; 455/209; 455/260
[58] Field of Search .................. 455/209, 255, 455/257, 258, 259, 260, 264, 316

[56] References Cited

U.S. PATENT DOCUMENTS

| | | | |
|---|---|---|---|
| 4,679,246 | 7/1987 | Jeng | 455/183.2 |
| 4,859,968 | 8/1989 | Gershon | 455/260 |
| 4,932,072 | 6/1990 | Toko | 455/264 |
| 5,163,164 | 11/1992 | Tults | 455/182.3 |
| 5,357,215 | 10/1994 | Greiderer | 331/25 |
| 5,361,407 | 11/1994 | Sawada et al. | 455/258 |
| 5,424,687 | 6/1995 | Fukuda | 331/18 |

OTHER PUBLICATIONS

I. Shimizu et al., NTT Electrical Communications Laboratories, "Measuring Method of Received Signal Frequency in Mobile Communications", Institute of Electronics and Comm. Engineers of Japan Comm. Part National Meeting 1986, No. 449.

I. Shimizu et al., NTT Electrical Communications Laboratories, "Received Frequency Detection in Mobile Radio Communications", Institute of Electronics and Comm. Engineers of Japan 70th Annual National Meeting 1987, No. 2197.

Primary Examiner—Reinhard J. Eisenzopf
Assistant Examiner—Marsha D. Banks-Harold
Attorney, Agent, or Firm—Rothwell, Figg, Ernst & Kurz

[57] ABSTRACT

A receiver which has a linear approximation expression showing a relationship between the frequency deviations and corresponding changes to the voltage which is to be supplied to the voltage controlled reference oscillator to adjust the deviation following a reception frequency. The frequency deviation of the voltage controlled temperature compensated crystal oscillator is calculated based on the count values of the counters which count the frequency of the second local oscillator and the second intermediate frequency. The control voltage supplied to the voltage controlled temperature compensated oscillator is changed based on the linear approximation expression. Further, the approximation expression is represented as a series of powers of 2 based on a sensitivity coefficient of the voltage controlled reference oscillator. The approximation expression is changed by renewing the sensitivity coefficient of the voltage controlled reference oscillator. Moreover, in addition to the control of the voltage controlled reference oscillator, the second local oscillator is controlled in the similar way of the control of the voltage controlled temperature compensated oscillator to obtain more accurate intermediate frequency.

8 Claims, 9 Drawing Sheets

RECEIVER WITH FUNCTION TO ADJUST LOCAL FREQUENCY FOLLOWING RECEPTION FREQUENCY

BACKGROUND OF THE INVENTION

1. Field of the Invention

This invention relates to a communication receiver which has a function to adjust a local frequency following a reception signal.

2. Description of the Prior Art

FIG. 8 is a block diagram showing a main part of a conventional receiver which has a function to adjust a local frequency. In this figure, numeral 10 denotes a voltage controlled temperature compensated crystal oscillator (hereinafter referred to as VC-TCXO) as a reference frequency oscillator, numeral 20 denotes a Phase Locked Loop (PLL) circuit for synthesizing a plurality of frequencies as first local frequencies, numeral 30 denotes a first mixer which mixes a reception signal with signals outputted from the PLL 20, numeral 40 denotes a second local oscillator which produces a signal having a frequency $f_{LO2}$, numeral 50 denotes a second mixer which mixes signals outputted from the first mixer 30 with the signal outputted from the second local oscillator 40, numeral 60 denotes a first counter which counts the frequency of a signal outputted from the second local oscillator 40, numeral 70 denotes a second counter which counts the frequency of a signal outputted from the second mixer 50, numeral 80 denotes an arithmetic processing unit for performing arithmetic processes in order to make the frequency of the VC-TCXO 10 converge fast based on the count results of the first counter 60 and the second counter 70, numeral 90 denotes a digital to analog (D/A) converter for supplying a control voltage to the VC-TCXO 10 based on the result of the arithmetic processes of the arithmetic processing unit 80. The PLL 20 consists of phase comparator 21, Low Pass Filter (LPF) 22, Voltage Controlled Oscillator (VCO) 23 and variable divider 24.

FIG. 9 shows deviations of the frequency of the signal outputted from the PLL 20 and the way in which the frequency is converged. FIG. 10 is a flow chart showing procedures for making the frequency deviation fall within a permissible range. Let $f_{IF1}$ be the frequency of the signal outputted from the first mixer 30 and let $f_{IF2}$ be the frequency of a signal outputted from the second mixer 50. Then, the following equations are established.

$$f_{IF1} = f_{RX} - f_{LO}, \quad f_{IF2} = f_{LO2} - f_{IF1}.$$

NOW, let $\Delta f_{LO}$ be a frequency deviation of a signal outputted from the V.C.O. 23, the following equations are established.

$$f'_{IF1} = f_{RX} - (f_{LO} + \Delta f_{LO}),$$

$$f'_{IF2} = f_{LO2} - f_{RX} + f_{LO} + \Delta f_{LO} = f_{LO2} - f_{IF1} + \Delta f_{LO}.$$

The equation $f'_{IF2} - f_{LO2} + f_{IF1} = \Delta f_{LO}$ is accordingly obtained. Therefore, the frequency deviation $\Delta f_{LO}$ is obtained using this equation. Then, the frequency deviation $\Delta f$ of a signal outputted from the VC-TCXO 10 is worked out based on the deviation $\Delta f_{LO}$.

The threshold frequencies $-y$ [Hz], $-x$ [Hz], $x$ [Hz] and $y$ [Hz] are set on the deviation frequency axis as shown in FIG. 9. Frequency ranges between $-x$[Hz] and $x$[Hz], between $-y$[Hz] and $-x$[Hz], between $x$[Hz] and $y$[Hz], lower than $-y$[Hz], and higher than $y$[Hz] are respectively referred to as A, B, C, D, and E. The range A is a permissible range of the frequency deviation of the VC-TCXO 10.

The detected frequency deviation is compared to each threshold frequency and the range to which the detected deviation belongs is judged. In each range, the voltage supplied to the VC-TCXO 10 is changed by a value corresponding to each range. The VC-TCXO 10 oscillates at a frequency according to the supplied voltage. That is, based on the count values counted at the first counter 60 and the second counter 70, the arithmetic processing unit 80 calculates the frequency deviation $\Delta f$ of the VC-TCXO 10 at step S901. At step S902, the arithmetic processing unit 80 checks whether the frequency deviation $\Delta f$ is within the range D or not. When the frequency deviation is within the range D, the voltage supplied to the VC-TCXO 10 is increased in the amount of a at step S903 and the sequence moves to step S901. Otherwise, the arithmetic processing unit 80 checks whether the frequency deviation $\Delta f$ is within the range B or not at step S904. When the frequency deviation is within the range B, the voltage supplied to the VC-TCXO 10 is increased in the amount of b at step S905 and the sequence moves to step S901. Otherwise, the arithmetic processing unit 80 checks whether the frequency deviation $\Delta f$ is within the range C at step S906. When the frequency deviation $\Delta f$ is within the range C, the voltage supplied to the VC-TCXO 10 is decreased in the amount of b at step S907 and the sequence moves to step S901. Otherwise, the arithmetic processing unit 80 checks whether the frequency deviation $\Delta f$ is within the range E or not at step S908. When the frequency deviation $\Delta f$ is within the range E, the voltage supplied to the VC-TCXO 10 is decreased in the amount of a at step S909 and the sequence moves to step S901. Otherwise, the receiver indicates that the frequency deviation of the VC-TCXO 10 is within the permissible range at step S910.

An example of frequency convergence depicted in FIG. 9 will be explained. When the first frequency deviation $\Delta f_1$ is within the range E, a control voltage supplied to the VC-TCXO 10 is decreased by a [V] corresponding to the range E. The arithmetic processing unit 80 calculates the second frequency deviation $\Delta f_2$ based on the count values of counters 60 and 70. When the second frequency deviation $\Delta f_2$ is also within the range E, a control voltage supplied to the VC-TCXO 10 is decreased by a [V] again. The arithmetic processing unit 80 calculates the third frequency deviation $\Delta f_3$ based on the count values of counters 60 and 70. When the third frequency deviation $\Delta f_3$ is now within the range C, a control voltage supplied to the VC-TCXO 10 is decreased by b [V] corresponding to the range C. The arithmetic processing unit 80 calculates the fourth frequency deviation $\Delta f_4$ based on the count values of counters 60 and 70. When the fourth frequency deviation $\Delta f_4$ is also within the range C, a control voltage supplied to the VC-TCXO 10 is decreased by b [V] again. The arithmetic processing unit 80 calculates the fifth frequency deviation $\Delta f_5$ based on the count values of counters 60 and 70. When the fifth frequency deviation $\Delta f_5$ is within the range A, the arithmetic processing unit 80 indicates that the frequency deviation of the VC-TCXO 10 is within the permissible range.

However, the above explained receiver has the following problem. Namely, a long time is needed for the frequency of the VC-TCXO 10 to converge within the permissible range and reduction of the time necessary for convergence is desired.

The related technology is described on "Measuring Method of Received Signal Frequency in Mobile Communication", the electronics and communication society, communication section, nationwide meeting 1986, No. 449.

SUMMARY OF THE INVENTION

In view of the foregoing, the first object of the invention is to reduce the time necessary for frequency convergence of the local oscillator in case of adjusting the frequency following a reception frequency.

The second object of the invention is to construct an arithmetic processing unit for the frequency convergence with a processor having simple functions.

To accomplish the above objects, the receiver of this invention has a linear approximation expression which shows a relationship between frequency deviations of the voltage controlled reference oscillator and corresponding changes to the voltage which is to be supplied to the voltage controlled reference oscillator in order to compensate the deviation. The frequency deviation of the voltage controlled reference oscillator is calculated based on count values of counters which count the frequency of the second local oscillator and the second intermediate frequency. The control voltage supplied to the voltage controlled reference oscillator is changed based on the linear approximation expression.

Further, the gradient of the approximation expression is represented as a series of power of 2 based on a sensitivity coefficient of the voltage controlled reference oscillator and goes through an original point. The approximation expression is changed by renewing the sensitivity coefficient of the voltage controlled reference oscillator.

Moreover, in addition to the control of the voltage controlled reference oscillator, the second local oscillator is also controlled in the similar way of the control of the voltage controlled reference oscillator.

DETAILED DESCRIPTION OF THE PREFERRED EMBODIMENTS

The preferred embodiments of the invention will be described in detail with reference to the drawings.

EMBODIMENT 1

Figure 1:
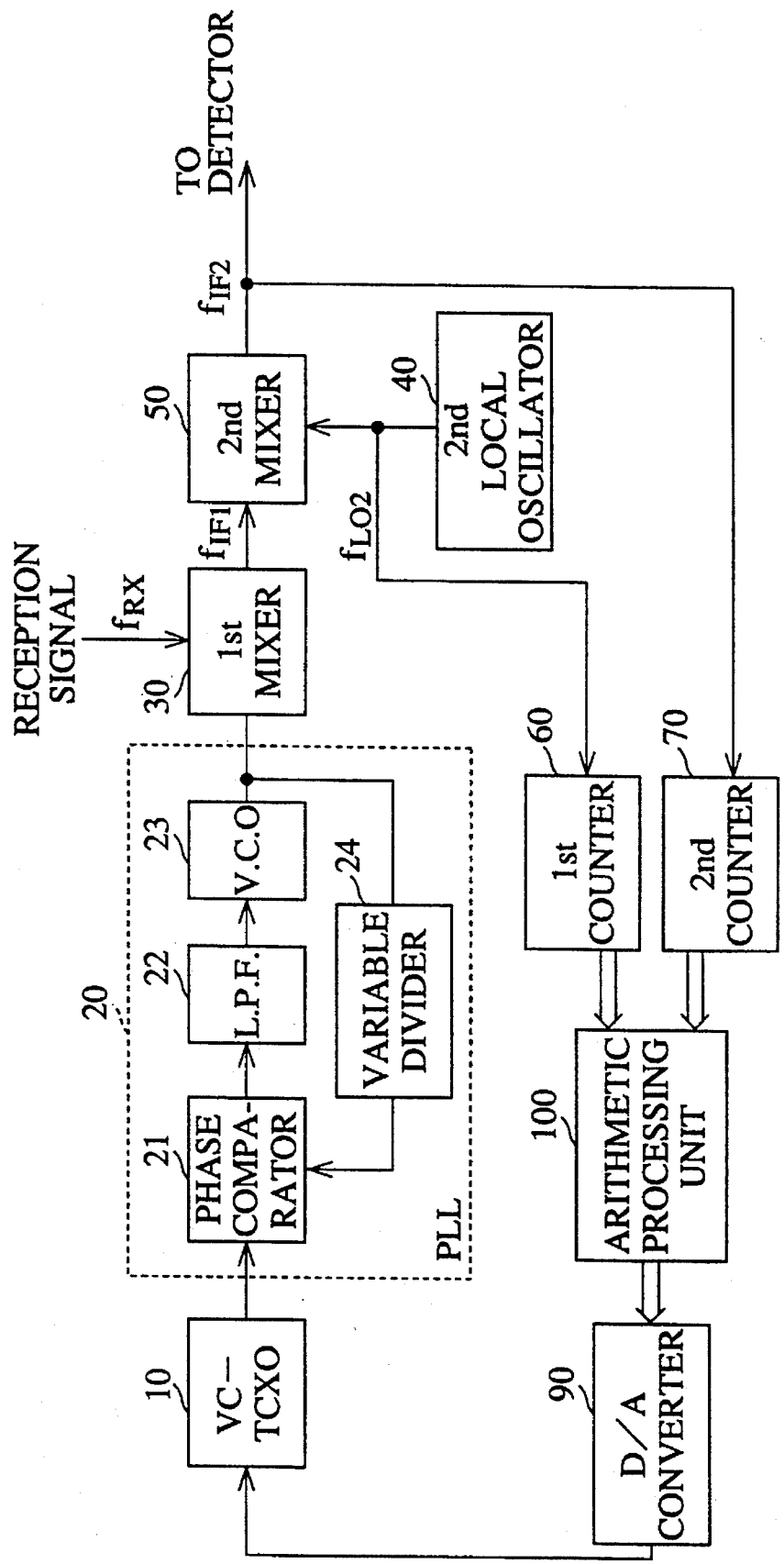
FIG. 1 is a block diagram showing a configuration of a main part of a receiver as the first embodiment of the invention.
Figure 8:
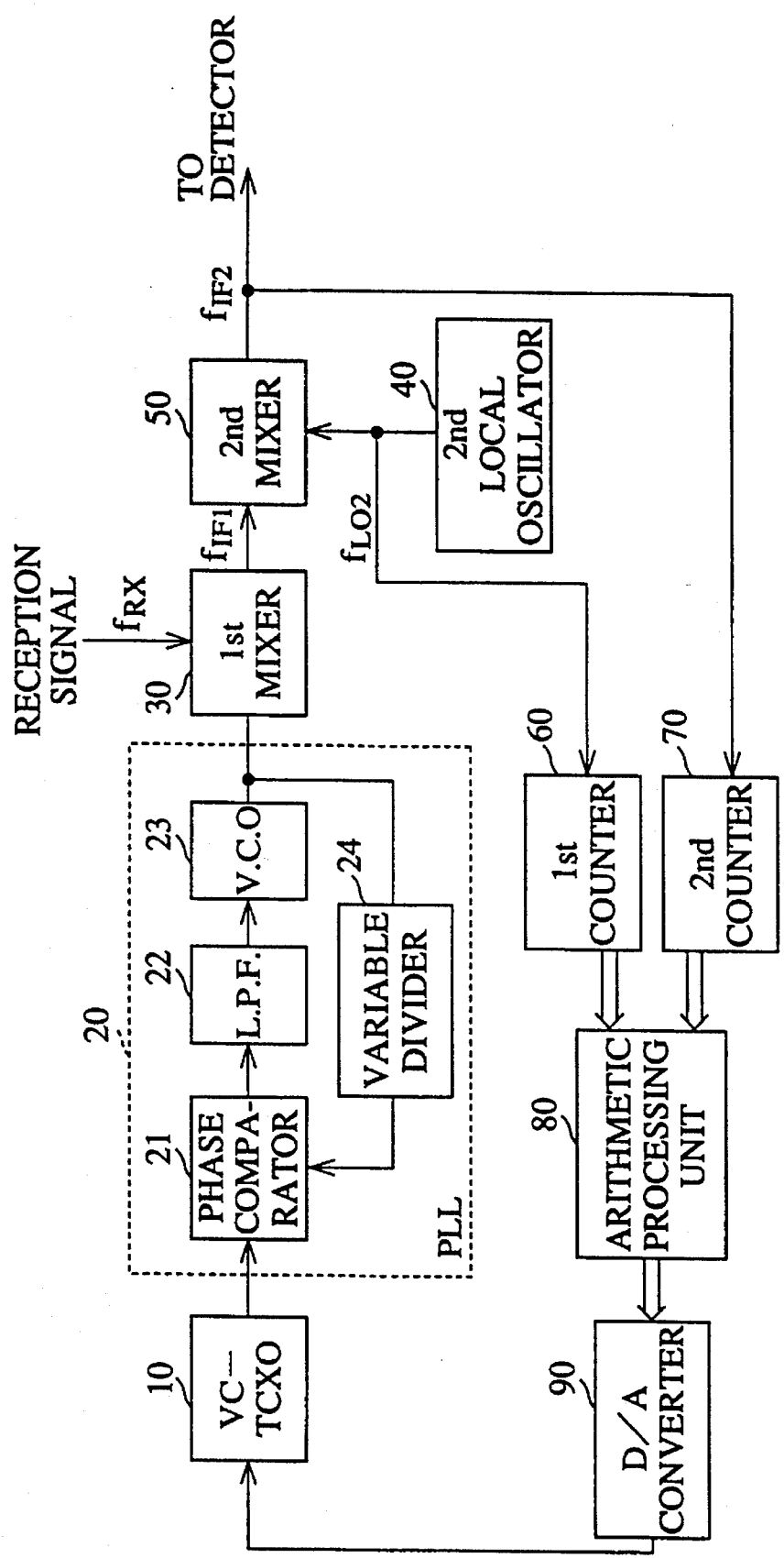
FIG. 8 is a block diagram showing a main part of a conventional receiver which has a function to adjust the frequency of a local oscillator.
Figure 9:
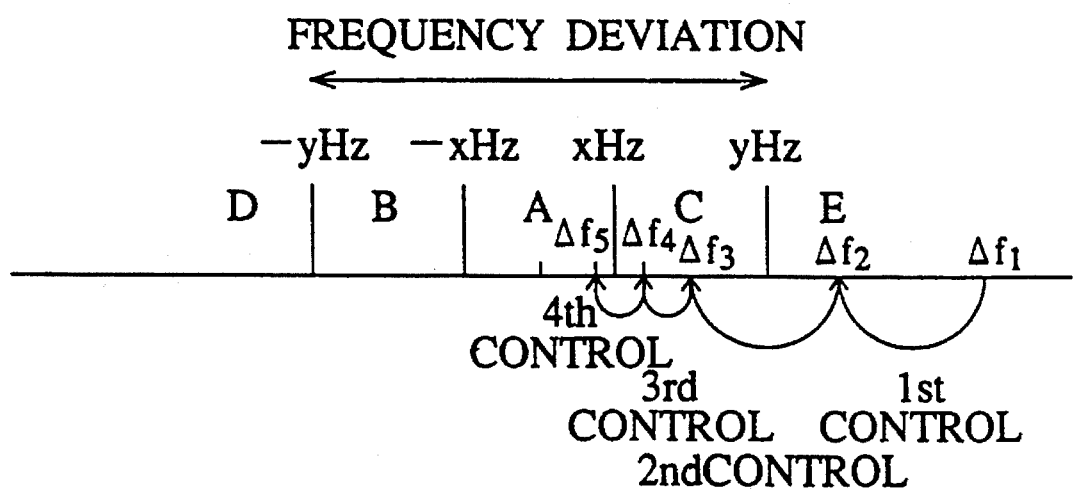
FIG. 9 shows deviations of the frequency of the signal outputted from the PLL and the way in which the frequency deviation is converged.
Figure 10:
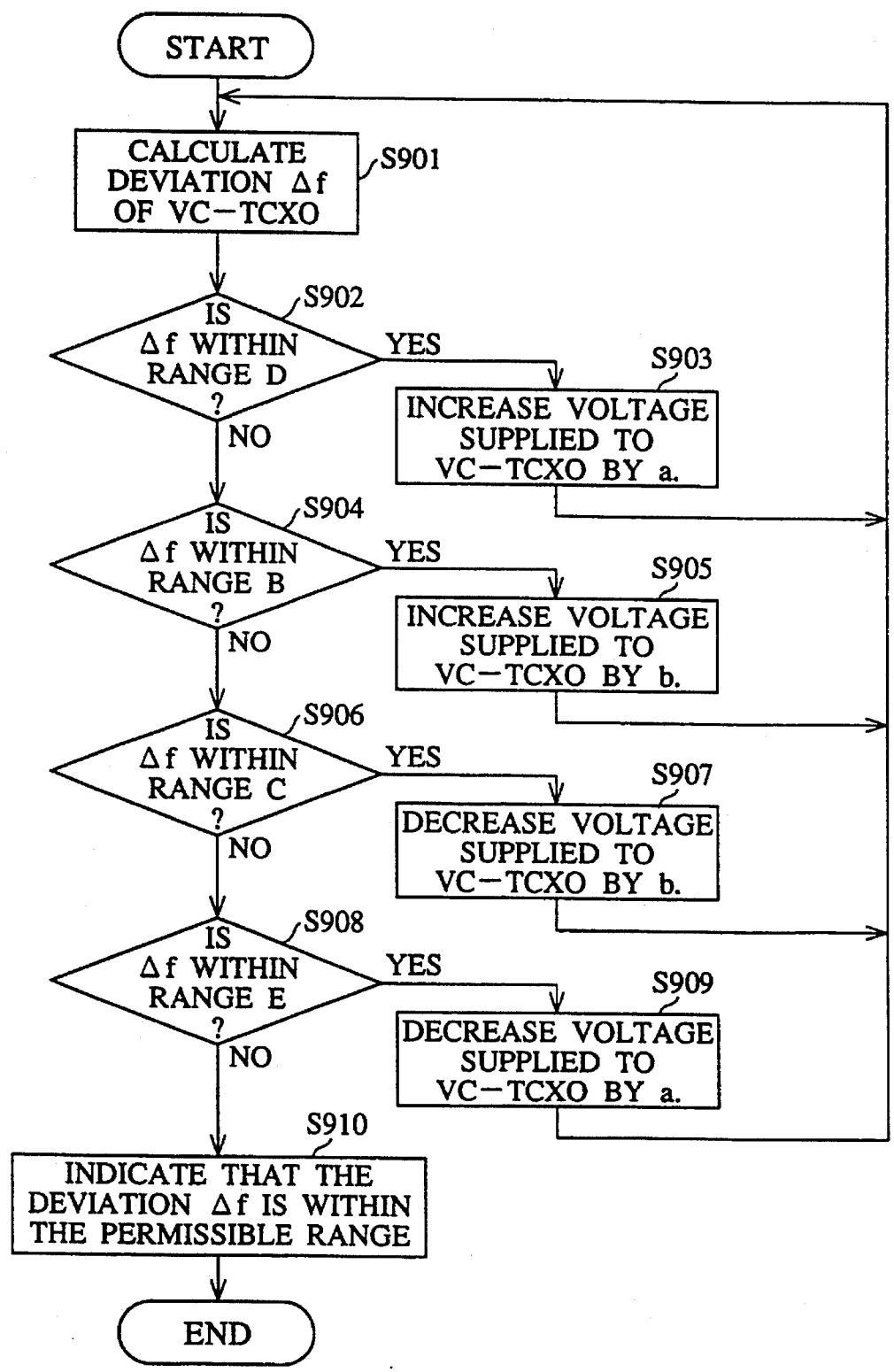
FIG. 10 is a flow chart showing the procedures for making the frequency deviation fall within the permissible range.

FIG. 1 is a block diagram showing a configuration of a main part of a receiver as the first embodiment of the invention. This figure is the same as FIG. 8 except for arithmetic processing unit 100. Thus, a detailed explanation of the components depicted in FIG. 1 other than the arithmetic processing unit 100 is omitted.

A receiver of this embodiment is so designed that a control voltage supplied to the VC-TCXO 10 is changed in proportion to the amount of the frequency deviation of the VC-TCXO 10. Further, the relationship between frequency deviations of VC-TCXO 10 and changes to a control voltage supplied to the VC-TCXO 10 is approximately represented as an expression using powers of 2 based on the voltage precision of the D/A converter 90.

Let the sensitivity coefficient of VC-TCXO 10 be $K_1$ [Hz/V] and the voltage precision of the D/A converter 90 be $D_1$ [V/bit], a voltage change necessary for compensating the frequency deviation is $\Delta f_{LO}/K_1$ and a change value of data to be supplied to the D/A converter 90 is $\Delta f_{LO}/(K_1 \cdot D_1)$. Then, this change of data value is approximately represented as the following expression:

$$\Delta f_{LO}/(K_1 \cdot D_1) \approx \Sigma a_n 2^n \Delta f_{LO}$$

wherein $-\infty < n < +\infty$, $a_n$ is properly selected as either 0 and 1. The data of this approximation expression are stored in the arithmetic processing unit 100 or outside of this unit 100. According to this expression, data to be sent to the D/A converter 90 is processed in the arithmetic processing unit 100.

When, for example, a change in data value is approximately represented as $\{(½)+(¼)\}\Delta f_{LO}$, firstly $(½)\cdot\Delta f_{LO}$ is calculated by shifting the bits of the value $\Delta f_{LO}$. Secondly $(¼)\cdot\Delta f_{LO}$ is calculated by shifting the bits of the value $(½)\cdot\Delta f_{LO}$. Finally the value $\{(½)+(¼)\}\Delta f_{LO}$ is calculated by adding the value $(¼)\cdot\Delta f_{LO}$ to the value $(½)\cdot\Delta f_{LO}$.

The value $\{(½)+(¼)\}\Delta f_{LO}$ is supplied to the D/A converter 90 and the D/A converter 90 outputs the voltage based on this value to the VC-TCXO 10 so as to compensate the frequency deviation of the VC-TCXO 10.

Figure 2:
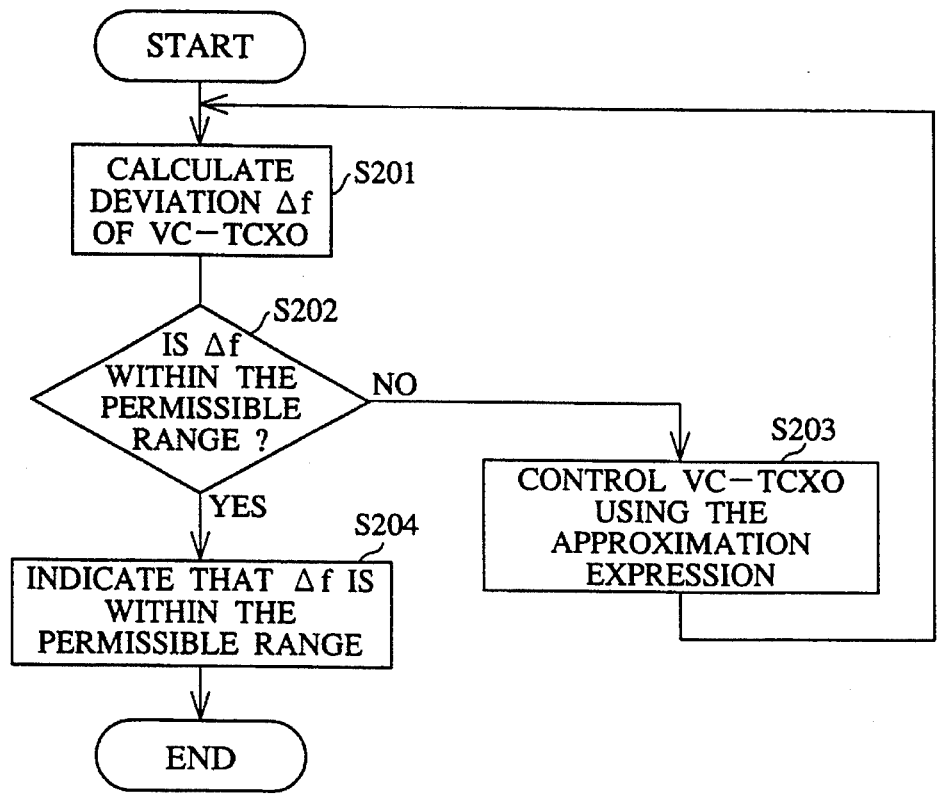
FIG. 2 is a flow chart showing frequency compensation operations of the receiver of the first embodiment.
Figure 3:
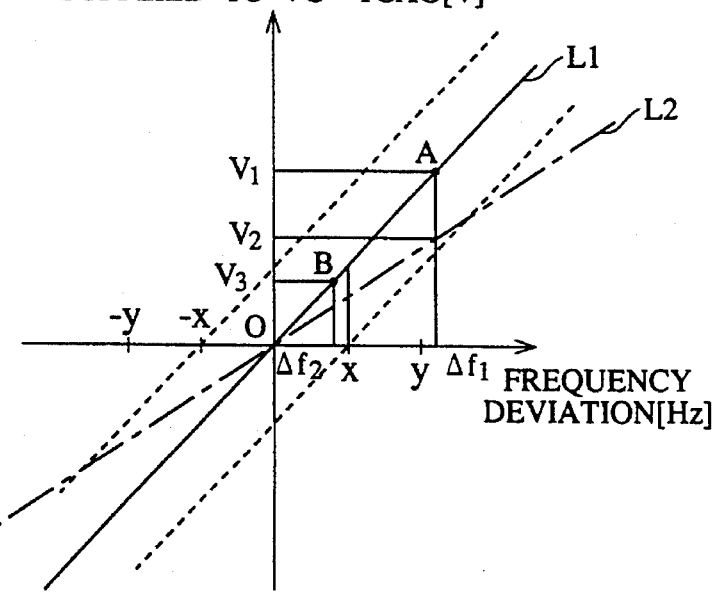
FIG. 3 is a graph showing a relationship between frequency deviation of VC-TCXO and a change of voltage to be supplied to the VC-TCXO in order to compensate the deviation.

FIG. 2 is a flow chart showing frequency compensation operations of the receiver of this embodiment. FIG. 3 is a graph showing a relationship between frequency deviation of VC-TCXO 10 and a change in voltage to be supplied to the VC-TCXO 10 in order to compensate the deviation. In FIG. 3, L1 denotes an ideal line to compensate a frequency deviation and L2 denotes an approximation line to compensate a frequency deviation using an expression of powers of 2. That is, the gradient of the line L2 is a series of power of 2. The range -x[Hz] to x[Hz] is a permissible range of a frequency deviation of the VC-TCXO 10.

At first, the arithmetic processing unit 100 calculates the frequency deviation of the V.C.O. 23 based on count values of the first and second counters 60 and 70. Then, a frequency deviation of the VC-TCXO 10 is worked out according to division rate of the variable divider 24 of the PLL 20 (step S201). If the deviation Δf is within the permissible range -x[Hz] to x[Hz], then an indication that the deviation is within the permissible range is performed (steps S202, S204). If the deviation Δf is not within the permissible range, a change in voltage to be supplied to the VC-TCXO 10 is worked out using the line L2 and VC-TCXO 10 is controlled based on the voltage change (step S203). For example, let the frequency deviation be Δf1, voltage change $V_2$ is obtained and the changed voltage is supplied to the TC-VCXO 10 through D/A converter 90. Then, the sequence proceeds to the step S201. At the step S201 this time, assume that the new frequency deviation is $\Delta f_2$ and the deviation $\Delta f_2$ is within the permissible range. This means that the status moves from the point A to the point B on the ideal line L1 in FIG. 3. Because the deviation $\Delta f_2$ is now within the permissible range, an indication that the deviation is within the permissible range is performed by turning on a Light Emitting Diode (LED) or displaying the corresponding message on a display at step S204. Then, the sequence terminates. When the frequency deviation $\Delta f$ does not fall within the permissible range by controlling the VC-TCXO 10 once, VC-TCXO 10 is repeatedly controlled until the deviation falls within the permissible range.

As described above, according to the first embodiment, convergence of frequency deviation is worked out in a shorter time period. Further, voltage data to be supplied to the D/A converter 90 are represented based on a series of powers of 2 so that the arithmetic processing unit 100 can be constructed by a simple processor having a bit shift function.

Figure 4:
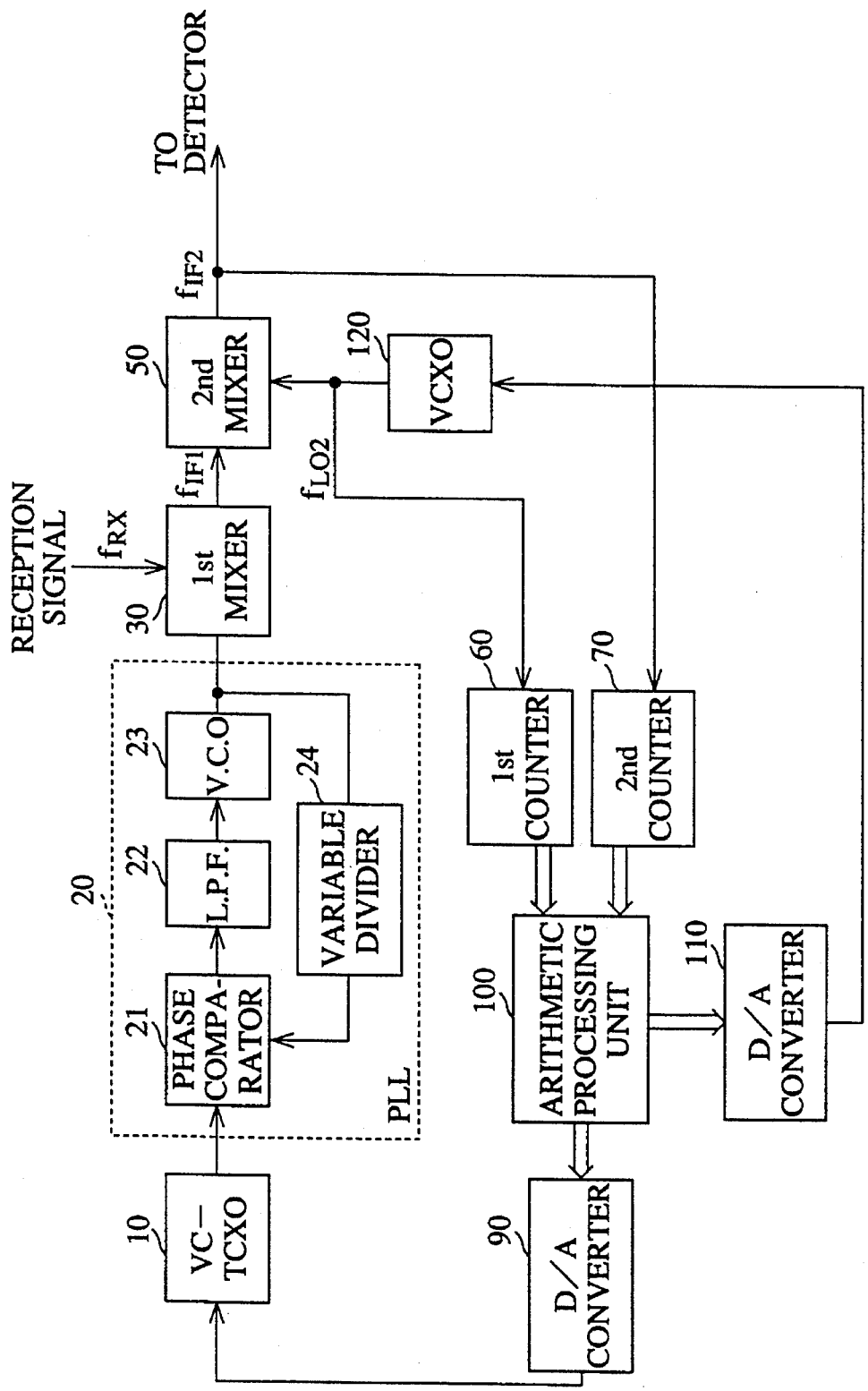
FIG. 4 is a block diagram showing a configuration of the second embodiment of the invention.

FIG. 4 is a block diagram showing a configuration of the second embodiment of the invention. The receiver described in FIG. 4 mainly differs from the one in FIG. 1 in that the second local oscillator 40 is replaced with the voltage controlled crystal oscillator (VCXO) 120 and the D/A converter 110 is further provided to control the VCXO 120 for the purpose of adjusting the second intermediate frequency $f_{IF2}$.

Figure 5:
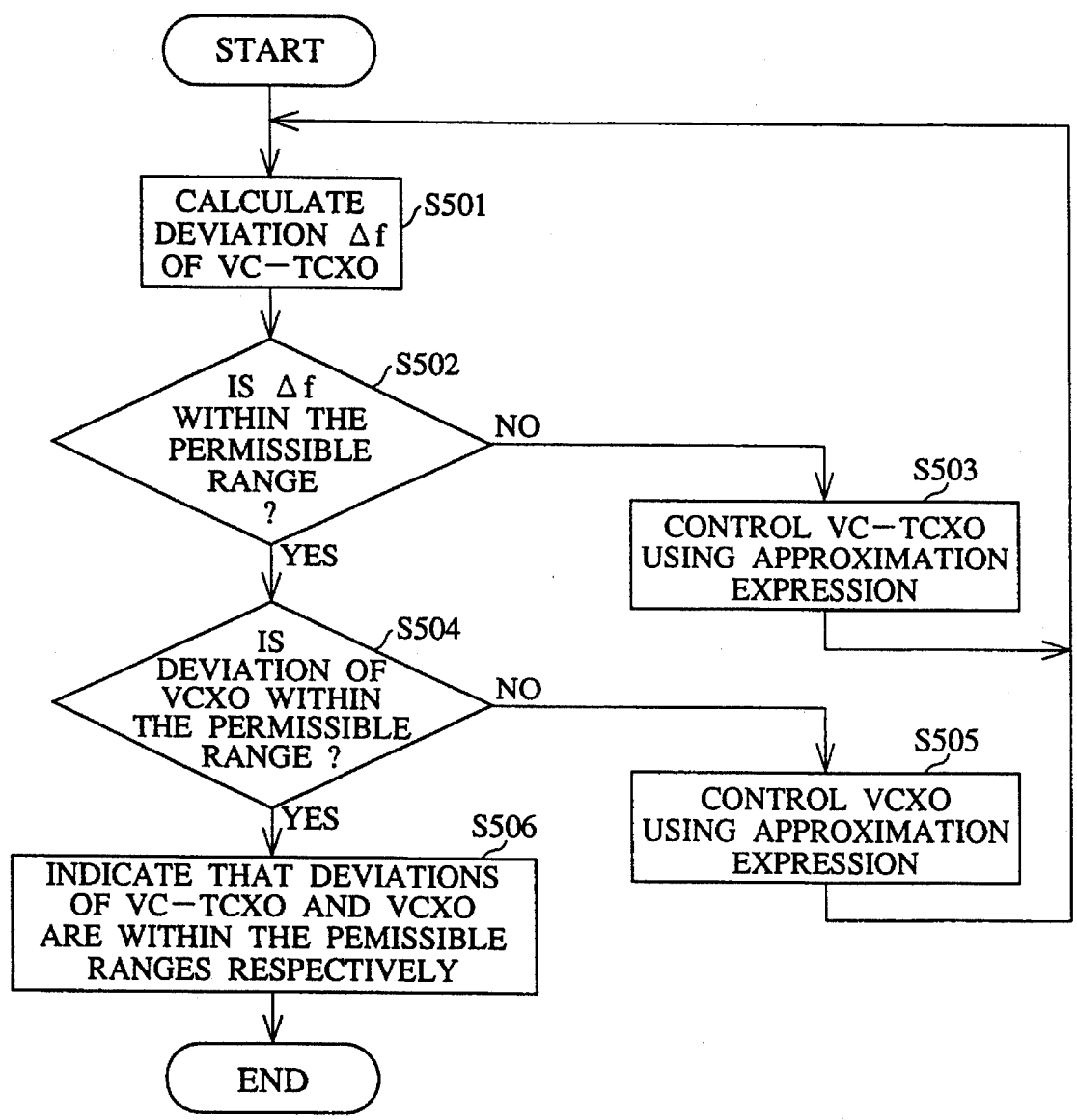
FIG. 5 is a flow chart showing an operational sequence of the receiver described in FIG. 4.

FIG. 5 is a flow chart showing a operation sequence of the receiver described in FIG. 4.

At first, the arithmetic processing unit 100 calculates the frequency deviation of the V.C.O. 23 based on count values of the first and second counters 60 and 70. Then, a frequency deviation of the VC-TCXO 10 is worked out according to a division rate of the variable divider 24 of the PLL (step S501). If the deviation $\Delta f$ of the VC-TCXO 10 is not within the permissible range $-x[Hz]$ to $x[Hz]$, a change in voltage to be supplied to the VC-TCXO 10 is worked out using the line L2 of FIG. 3 and VC-TCXO 10 is controlled based on the voltage change (step S503). Then, the sequence moves from step S503 to step S501. If the frequency deviation $\Delta f$ is within the permissible range and the frequency deviation of VCXO 120 is not within the VCXO permissible range, then the VCXO 120 is controlled by using an approximation expression which is similar to the one described in the first embodiment (steps S502, S504 and S505) and the sequence moves from S505 to step S501. At the step S504, if the deviation of VCXO 120 is within the VCXO permissible range, then an indication is performed that the deviations of VC-TCXO 10 and VCXO are within the permissible ranges respectively by turning on an LED or displaying a corresponding message on a display (step S506). Then, the sequence terminates.

As described above, according to the second embodiment, in addition to the control of VC-TCXO 10, the VCXO 120 as the second local oscillator is controlled. Thus, more accurate intermediate frequency $f_{IF2}$ can be obtained.

Figure 6:
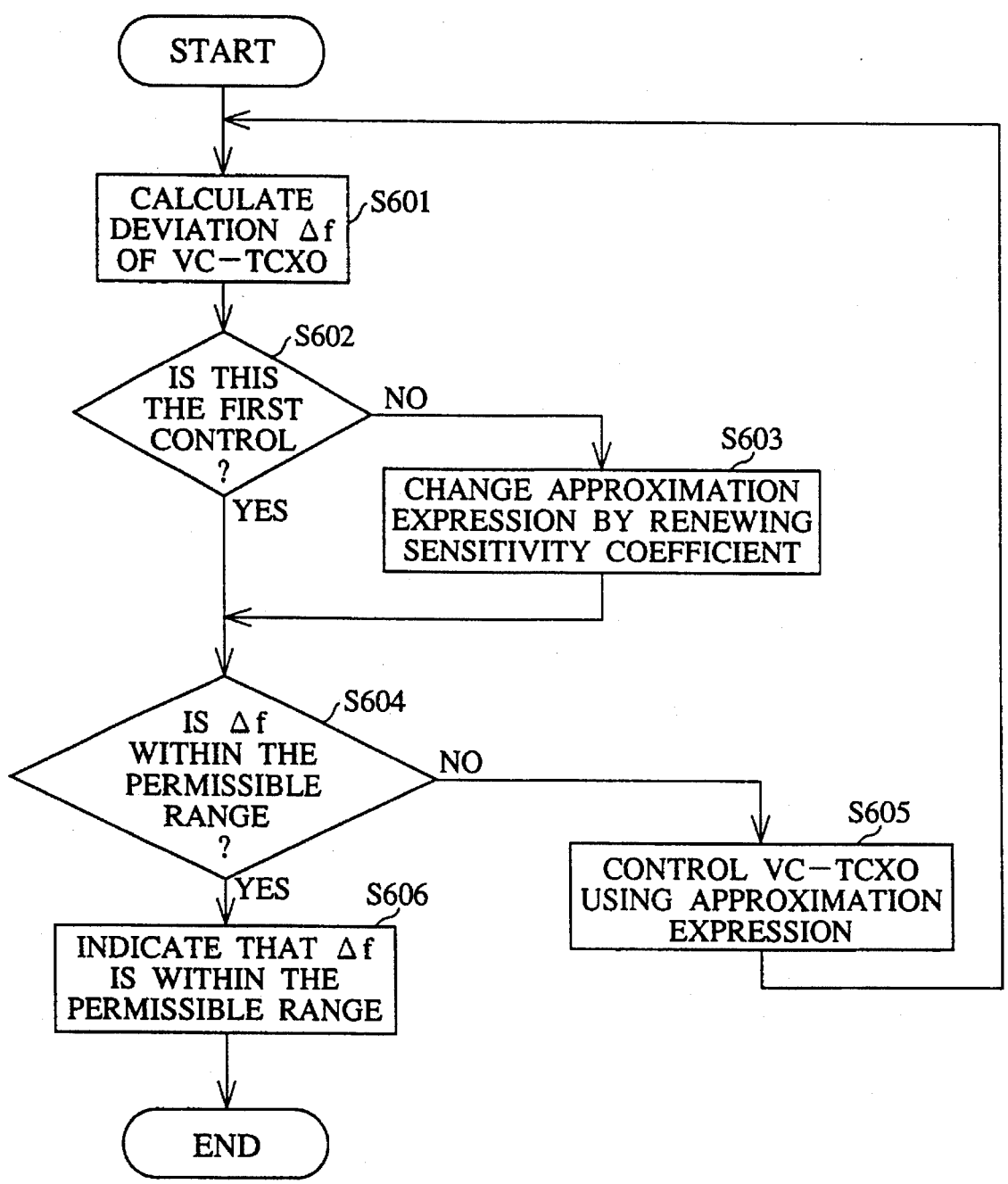
FIG. 6 is a flow chart showing an operational sequence in the receiver described in FIG. 1.

FIG. 6 is a flow chart of another embodiment of this invention, showing an operational sequence of the receiver described in FIG. 1.

In this embodiment, the sensitivity coefficient K1 of the VC-TCXO 10 is adjusted when the VC-TCXO 10 is controlled after the first control of the VC-TCXO 10. Let the first frequency deviation be $\Delta f_1$, the second frequency deviation be $\Delta f_2$ and the control voltage change corresponding to the first frequency deviation $\Delta f_1$ be $V_1$, the sensitivity coefficient K1 is replaced with $(\Delta f_1 - \Delta f_2)/V_1$ for the next control of VC-TCXO 10.

At first, the arithmetic processing unit 100 calculates the frequency deviation of the V.C.O. 23 based on count values of the first and second counters 60 and 70. Then, a frequency deviation of the VC-TCXO 10 is worked out according to a division rate of the variable divider 24 of the PLL (step S601). Then, whether the present control is the first control or not is judged (step S602). If the present control is not the first control, the sensitivity coefficient K1 is replaced with the new one as described above and an approximation expression is changed based on the new sensitivity coefficient (step S603). Then, whether the frequency deviation $\Delta f$ is within the permissible range or not is judged (step S604). At step S602, if the present control is the first control, the sequence moves directly to step S604. At step S604, if the deviation is not within the permissible range, the VC-TCXO 10 is controlled using the approximation expression as described in the first embodiment (step S605) and the sequence moves from step S605 to step S601. At step S604, if the deviation is within the permissible range, an indication is performed that the deviation $\Delta f$ is within the permissible range by turning on an LED or displaying the corresponding message on a display (step S606). Then, the sequence terminates.

As described above, according to the third embodiment, every time the VC-TCXO 10 is controlled except for the first control, the sensitivity coefficient K1 used in the approximation expression is renewed. Therefore, the apparatus of this embodiment can cope with aged deterioration or changes of properties.

Figure 7:
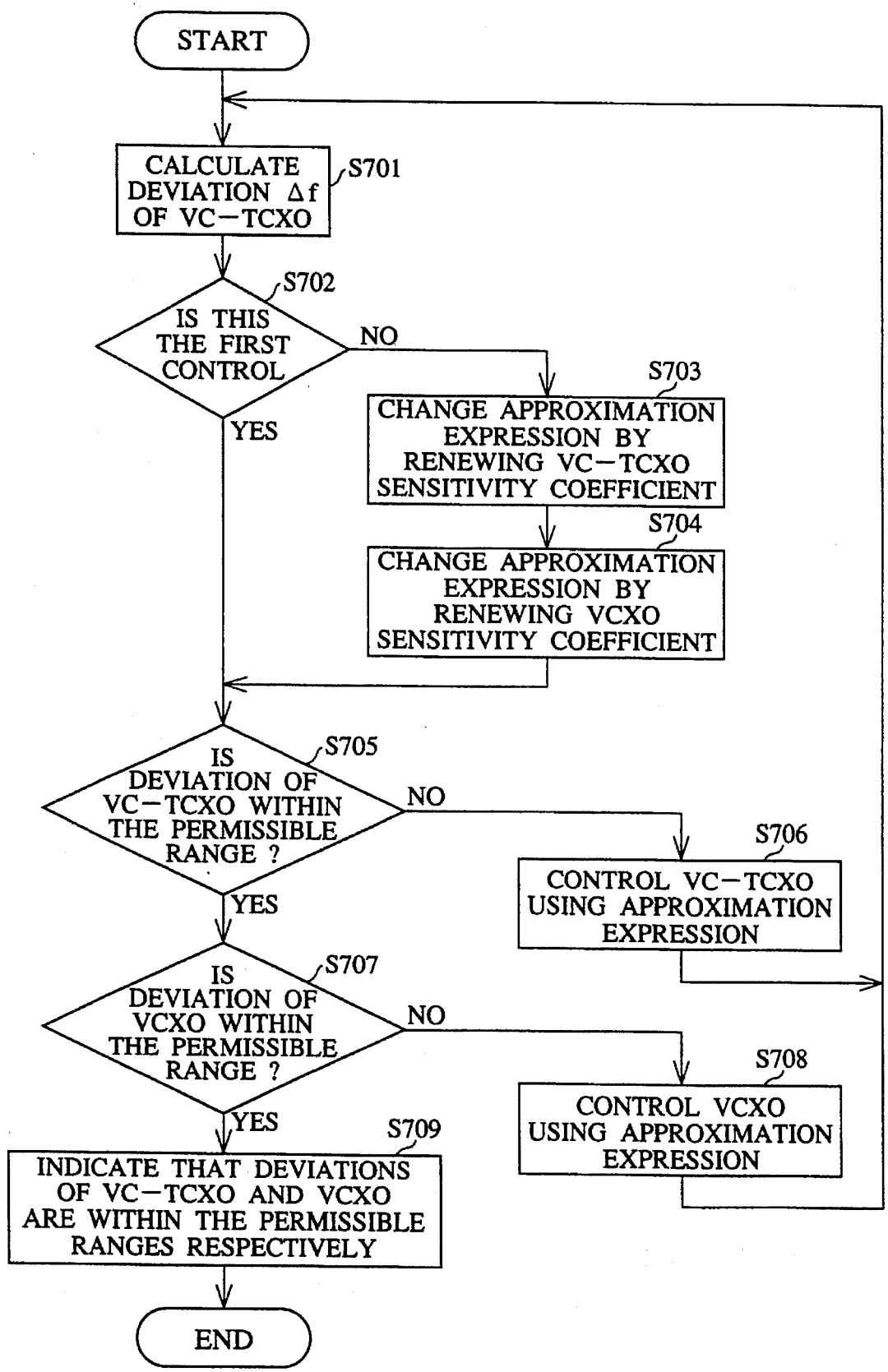
FIG. 7 is a flow chart showing another embodiment of operational sequence in a receiver described in FIG. 4.

FIG. 7 is a flow chart showing a fourth embodiment of operational sequence in a receiver described in FIG. 4.

In this embodiment, frequencies of VC-TCXO 10 and VCXO 120 are controlled and every time they are controlled except for the first control, the sensitivity coefficients used in approximation expressions of VC-TCXO 10 and VCXO 120 respectively are renewed.

At first, the arithmetic processing unit 100 calculates the frequency deviation of the V.C.O. 23 based on count values of the first and second counters 60 and 70. Then, a frequency deviation of the VC-TCXO 10 is worked out according to a division rate of the variable divider 24 of the PLL 20 (step S701). Then, whether the present control is the first control or not is judged (step S702). If the present control is not the first control, the sensitivity coefficient of VC-TCXO 10 is replaced with the new one as described in the third embodiment and an approximation expression for VC-TCXO 10 is changed based on the new sensitivity coefficient (step S703). Then, the sensitivity coefficient of VCXO 120 is replaced with a new one in the same manner as described about the sensitivity coefficient of the VC-TCXO 10 in the third embodiment and an approximation expression for VCXO 120 is changed based on the new sensitivity coefficient (step S704). Then, whether the frequency deviation of the VC-TCXO 10 is within the permissible range or not is judged (step S705). At step S702, if the present control is the first one, the sequence directly moves to step S705. At step S705, if the deviation of the VC-TCXO 10 is not within the permissible range, the VC-TCXO 10 is controlled using an approximation expression (step S706) and the sequence moves to step S701. At step S705, if the deviation is within the permissible range, then whether the frequency deviation of the VCXO 120 is within the VCXO permissible range or not is judged (step S707). If the deviation of the VCXO 120 is not within the VCXO permissible range, then the VCXO 120 is controlled using an approximation expression in the same manner as described about the control of the VC-TCXO 10 (step S708) and the sequence moves to step S701. At step 707, if the deviation of the VCXO 120 is within the VCXO permissible range, then an indication is performed that the deviations of the VC-TCXO 10 and the VCXO 120 are within the permissible ranges respectively by turning on an LED or displaying the corresponding message on a display (step S709). Then, the sequence terminates.

As described above, according to the fourth embodiment, the sensitivity coefficient of VCXO 120 as well as that of VC-TCXO 10 is renewed every time the VCXO 120 is controlled except for the first control. Therefore, more accurate intermediate frequency is obtained.

What is claimed is:

1. A receiver, comprising:

a voltage controlled reference oscillator which produces a reference frequency signal;

a phase locked loop circuit for functioning as a first local oscillator including a voltage controlled oscillator which produces a first local signal based on the reference frequency signal;

a first mixer which mixes a reception signal with the first local signal and produces a first intermediate frequency signal;

a second local oscillator which produces a second local signal;

a second mixer which mixes the first intermediate frequency signal with the second local signal and produces a second intermediate frequency signal;

a first counter which counts a frequency of the second local signal;

a second counter which counts a frequency of the second intermediate frequency signal;

a first digital-to-analog converter for supplying a control voltage to the voltage controlled reference oscillator;

means for storing information representing a relationship between frequency deviations of the voltage controlled reference oscillator and corresponding voltage changes to said control voltage for compensating the frequency deviations, the relationship being represented as a first linear expression;

means for calculating a frequency deviation of the voltage controlled reference oscillator based on count values of the first and the second counters; and means for supplying control data to the first digital to analog converter and for changing the control data based on the information so as to compensate the frequency deviation when the frequency deviation of the voltage controlled reference oscillator is not within a permissible range, the control data corresponding to the control voltage to be supplied to the voltage controlled reference oscillator.

2. A receiver according to claim 1, wherein the first expression is a first approximation expression which goes through an origin point and the gradient of which first approximation expression is approximately represented as a series of the powers of 2.

3. A receiver according to claim 2, wherein the first approximation expression is based on a sensitivity coefficient of the voltage controlled reference oscillator.

4. A receiver according to claim 3, further comprising means for changing the first approximation expression by renewing a sensitivity coefficient of the voltage controlled reference oscillator when a voltage supplied to the voltage controlled reference oscillator is changed.

5. A receiver according to claim 3, wherein the second local oscillator consists of a voltage controlled crystal oscillator, wherein the receiver further has a second digital-to-analog converter for supplying a control voltage to the second local oscillator; means for calculating a frequency deviation of the second local oscillator based on count value of the first counter; means for storing information of a relationship between frequency deviations of the second local oscillator and corresponding voltage changes for compensating this frequency deviation, the relationship being represented as a second linear expression; and means for supplying control data to the second local oscillator and for changing the control data based on the second linear expression so as to compensate the frequency deviation when the frequency deviation of the second local oscillator is not within a permissible range.

6. A receiver according to claim 4, wherein the second expression is a second approximation expression which goes through an origin point and the gradient of which second approximation expression is approximately represented as a series of power of 2.

7. A receiver according to claim 6, wherein the second approximation expression is based on a sensitivity coefficient of the second local oscillator.

8. A receiver according to claim 7, further comprising means for changing the second approximation expression by renewing a sensitivity coefficient of the second local oscillator when a voltage supplied to the second local oscillator is changed.

* * * * *